United States Patent [19]

Hudson et al.

[11] 3,841,261

[45] Oct. 15, 1974

[54] SELF-ALIGNING ETCH-OUT SPRAY MASK

[75] Inventors: James L. Hudson; Larry L. Jordan, both of Kokomo, Ind.

[73] Assignee: General Motors Corporation, Detroit, Mich.

[22] Filed: Jan. 22, 1973

[21] Appl. No.: 325,227

[52] U.S. Cl. .............................................. 118/505

[51] Int. Cl. .............................................. B05b 15/04

[58] Field of Search ........... 118/504, 505, 406, 301, 118/48–49.5; 117/38; 156/16, 17

[56] References Cited

UNITED STATES PATENTS

| | | | |
|---|---|---|---|
| 2,958,147 | 11/1960 | Monahan | 156/16 X |
| 2,959,152 | 11/1960 | Byers et al. | 118/505 |
| 3,002,847 | 10/1961 | Shaffer et al. | 118/505 X |
| 3,170,810 | 2/1965 | Kagan | 118/505 X |
| 3,226,245 | 12/1965 | Dettling et al. | 118/505 X |
| 3,226,255 | 12/1965 | Cieniewicz et al. | 118/504 X |
| 3,678,887 | 7/1972 | Smith | 118/504 |

*Primary Examiner*—Morris Kaplan

*Attorney, Agent, or Firm*—Robert J. Wallace

[57] ABSTRACT

A self-aligning spray mask and a method of using the spray mask to selectively spray a maskant onto a semiconductor wafer face. The wafer face has a pattern of ridges thereon. The spray mask is of a magnetic metal and has portions with a pattern of grooves corresponding to the pattern of ridges on the semiconductor wafer face. The spray mask is magnetically held against the wafer face. The wafer ridges nest in the grooves of the spray mask, thus self-aligning the mask on the semiconductor wafer face for spraying of the maskant.

1 Claim, 3 Drawing Figures

PATENTED OCT 15 1974

3,841,261

SELF-ALIGNING ETCH-OUT SPRAY MASK

BACKGROUND OF THE INVENTION

This invention relates to a distinctive spray mask used to selectively spray a maskant onto portions of a semiconductor wafer face. More particularly, it relates to a magnetically held spray mask which interlocks with a pattern of ridges on the wafer face for self-alignment.

One widely used method of forming small discrete dies from a large wafer of semiconductive material involves chemical etching. In this method, one etches a grid pattern completely through the wafer, thus producing a plurality of discrete dies. A maskant, usually wax, is applied to selected portions on one face of the wafer to resist etching of these portions. The wax is sprayed onto the selected portions through apertures in a spray mask which is seated on the wafer face. Portions of the mask cover regions on the wafer which form the grid pattern, and hence shield them from the wax. These regions, free from wax, will be subsequently etched.

OBJECTS AND SUMMARY OF THE INVENTION

An object of this invention is to provide a self-aligning spray mask which interlocks with a pattern of ridges on a semiconductor wafer.

Another object of this invention is to provide an improved method for applying a mask to selected portions of a semiconductor wafer, particularly a wafer containing a plurality of mesa emitter devices.

This invention involves a sheet of magnetic material having apertures therein corresponding to semiconductor wafer portions onto which a maskant is to be sprayed. One face of the sheet has a pattern of grooves between the apertures corresponding to a pattern of ridges on a face of the wafer. The grooves on the sheet face have a width and depth slightly greater than the width and height of the wafer ridges, permitting the ridges to nest in the grooves, and the sheet face to abut the wafer face. The nesting of the wafer ridges in the sheet grooves aligns the apertures in the sheet with the wafer portions to be sprayed, and interlocks the sheet with the wafer. The sheet can be magnetically held against the wafer while the maskant is sprayed.

DESCRIPTION OF THE PREFERRED EMBODIMENT

Figures 1, 2, 3:
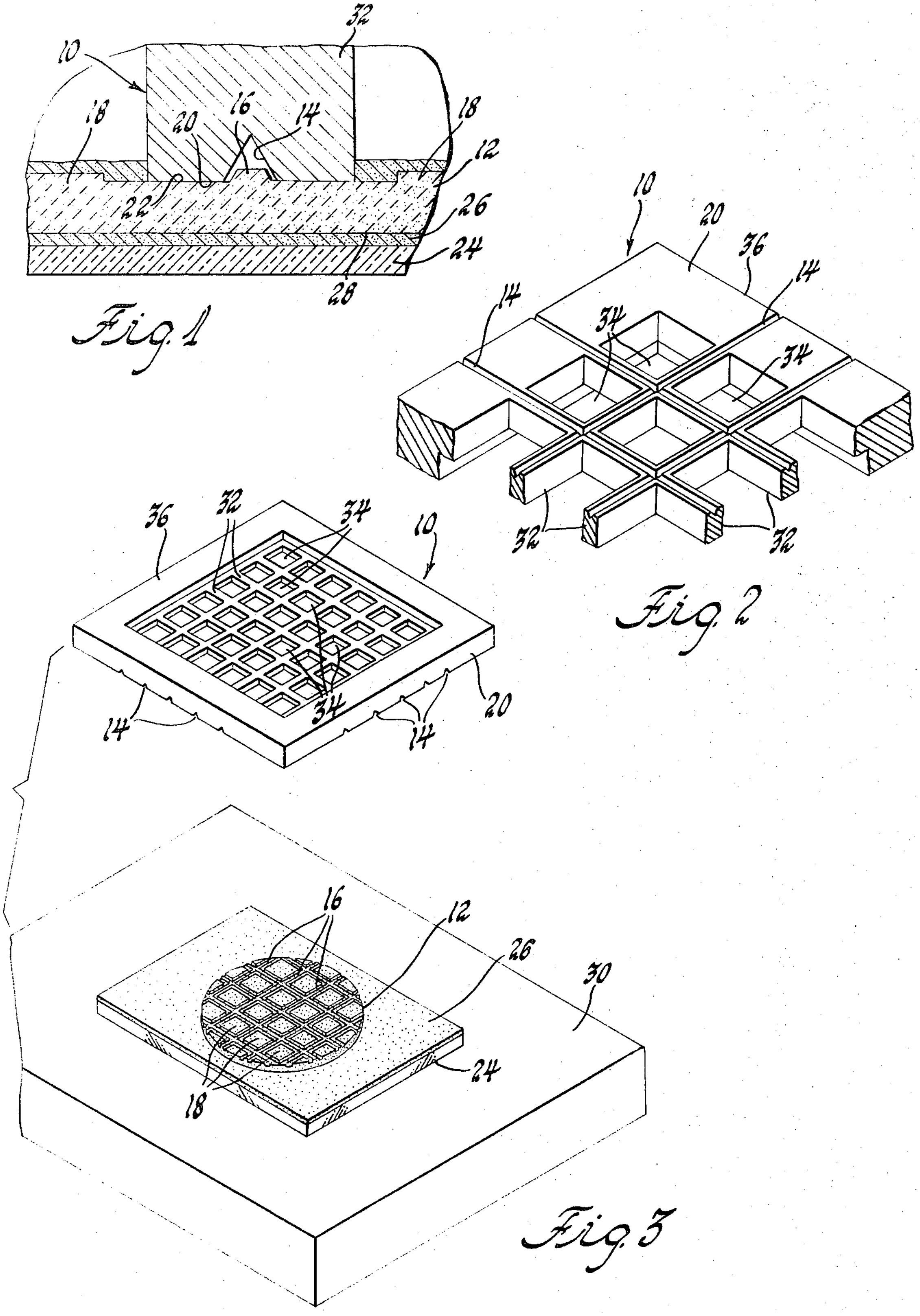
FIG. 1 is an enlarged fragmentary sectional view illustrating abutment in the groove-ridge area of the spray mask and semiconductor wafer shown in FIG. 3.
FIG. 2 is an enlarged fragmentary isometric inverted view of the spray mask in partial section.
FIG. 3 is an exploded isometric view of a spray mask made according to this invention, and a ridged semiconductor wafer on a magnet.

Turning now to the drawings, it can be seen that the invention involves a spray mask 10 for use on a wafer 12 of a semiconductor such as silicon or germanium. The spray mask has grooves 14 on one face 20 that correspond to a pattern of ridges 16 on the semiconductor wafer 12. The ridges 16 on the wafer reside in the regions of the wafer to be etched away and lie between the portions of the wafer to be masked. The portions of the wafer to be masked contain active semiconductor devices. This invention is most applicable to wafers in which the portions to be masked have active devices with mesa emitters 18.

In such wafers having mesa emitter devices, the ridges 16 do not have to be formed in a separate processing operation. They can be formed at the same time the emitter mesas are being produced. A commonly used method of forming mesa emitters is to apply a photoresist, such as KMER, to the entire face of a planar semiconductor wafer on which the emitter mesas are to be formed. A mask is placed on the wafer face exposing only the portions where the mesas are to be formed. The masked photoresist is subjected to ultraviolet light. The photoresist is then developed, which removes the resist from all the wafer portions except those subjected to the ultraviolet light. The wafer is then placed in a chemical etchant to etch away the unprotected portions of the wafer face. The etchant erodes away these regions until a plurality of discrete raised, or mesa, emitters on the semiconductor wafer are produced.

To form a pattern of ridges between these mesa emitters, one need only redesign the mask to concurrently also expose the photoresist in the desired ridge pattern when the mesa emitter portions are exposed to the ultraviolet light. One then would subject the wafer to the same developing and etching process as described above for mesa emitters. On development of the resist the wafer face is not only protected in the mesa portions but also in the intersecting grid pattern between them. On etching the wafer face to form the emitter mesas, one concurrently produces a pattern of intersecting ridges between the emitter mesas that are coplanar with the mesas.

Spray mask 10 seats on wafer 12, with wafer ridges 16 nesting in the spray mask grooves 14, and spray mask face 20 abutting wafer surface 22 between ridges 16 and around emitter mesas 18. Surface 28 of the wafer 18 is bonded to a glass slide 24 with wax 26. The glass slide 24 is in turn supported on a permanent magnet 30.

The spray mask 10 shown in the drawings is made for use with a one inch diameter wafer and is made of a magnetic metal. By magnetic metal we mean a metal that is magnetized or capable of being magnetized. The spray mask is essentially a square grid having intersecting portions 32 surrounding a plurality of apertures 34, and a thicker peripheral rim portion 36 surrounding the grid. The intersecting portions 32 and rim 36 are coplanar on one face 20 of the mask and form a rigid unitary body. The pattern of grooves 14 on planar face 20 extend throughout intersecting portions 32 and on across the rim 36.

The geometry and size of the spray mask is necessarily a function of the size of the wafer to be masked and the geometry and size of the discrete dies to be made from the wafer. In the embodiment disclosed herein, we describe a spray mask for use on a one inch diameter silicon wafer from which 0.180 inch square dies are to be made.

Intersecting portions 32 of the mask in this preferred embodiment are shown to be rectangular in cross section. However, they can be of any cross section that provides a flat surface for planar face 20. In this embodiment they have a width of 0.020 inch and a height of 0.03 inch. As shown, there are five parallel rows and five parallel columns about 1.20 inches long which intersect perpendicularly to form a grid having square apertures 34 approximately 0.180 inch per side.

Peripheral rim 36 is an integral rectangular border for the grid that gives the spray mask 10 added strength and rigidity. Even though rim 36 is thicker than the grid, one surface is flat and coplanar with the grid to form flat working face 20. In this embodiment, rim 24 is 0.160 inch wide on face 20, and 0.120 inch thick. Since the grid is thinner, the rim is recessed opposite face 20 to a 0.100 inch width.

The grooves 14 in intersecting portions 32 extend across peripheral rim 36 in a continuous intersecting pattern on face 20 corresponding to the pattern of ridges 16 on semiconductor wafer 12. By referring to FIG. 1, the relationship of groove 14 to ridges 16 of semiconductor wafer 12 will be better understood. Grooves 14 are only slightly wider and deeper than ridges 16 to permit easy nesting of the ridges 16 in grooves 14, but yet maintain reasonably accurate alignment. The groovs 14 are preferably V-shaped. One of the reasons for the V-shape is that the sides of the ridges 16 which have been exposed to the etchant during the chemical etching process slope slightly toward one another due to inherent characteristics of the process. The V-shape of the grooves 14 allow the ridges 16 to nest snug within the grooves. Thus accurate alignment ± 1½ mils, can be obtained. Another, even more important, reason is that the depth and width of the grooves may be easily kept within tolerances when they are machined into the face 20 of the spray mask 10. A V-shaped groove width of approximately 0.008 inch on face 20 and a depth of approximately 0.007 inch subtending an angle of approximately 60° is satisfactory for wafer ridges that are rectangular in cross section and about 0.004 inch wide and 0.001 inch high. However, the grooves 14 may be other than V-shaped. The basic requirement of the grooves is that they correspond with the pattern of ridges on the semiconductor wafer and permit easy nesting of the ridges in the grooves so that the face of the spray mask abuts the surface of the semiconductor wafer.

It should be noted that there may be variations of this preferred embodiment that are within the spirit of this invention. The particular construction of the spray mask, as hereinbefore mentioned, is primarily determined by the geometry and size of the die to be separated from the semiconductor wafer. Another important factor to consider is the number of discrete dies to be produced from the wafer. For example, the number of and space between the intersecting portions of the spray mask will depend directly upon these factors. The width of the intersecting portions will depend upon the space to be covered on the semiconductor wafer during the wax application process. The size and shape of the peripheral rim may be varied widely depending upon the number of intersecting portions and the rigidity and other characteristics needed for production use.

Turning again to the drawings, we will now discuss how the spray mask of the invention can be used. Surface 28 of semiconductor 12 is secured to a supporting glass slide 24 by an adhesive 26. The adhesive in this example is wax that has previously been sprayed onto the glass slide support 24. Referring especially to FIG. 3, glass slide 24 with semiconductor wafer 12 affixed thereon, is placed on bar magnet 30 so that the face of semiconductor wafer 12 containing ridges 16 and mesa emitters 18 face outward from the magnet. To conclude the assembly, the spray mask 10 is seated on the semiconductor wafer 12 so that the pattern of ridges 16 nest in the grooves 14 of the spray mask 10. The spray mask 10 being of magnetic metal is held in place by magnetic force from magnet 30. The nesting of the pattern of ridges 16 in grooves 14 of the spray mask 10 interlock the spray mask with the wafer 12 and aligns the apertures 34 of the spray mask 10 with selected portions of the semiconductor wafer 12 on which wax is to be deposited. Wax is then sprayed by the usual method onto the spray mask 10 and selected portions of the semiconductor wafer 18. The spray mask is then removed, the wax is fused, and the semiconductor wafer is etched by the usual procedure in a separate process to form a plurality of discrete dies from the wafer.

One skilled in the art will realize that an incidental advantage of this invention is that the magnetic force can easily be made strong enough to permit vertical orientation of the major surfaces to facilitate assembly and/or spraying of the maskant. Although the magnetic force that held spray mask 10 was produced by bar magnet 30, it should be noted that this magnetic force may be from other than a permanent magnet, for example, an electromagnet. Another variation that may be used within the spirit of this invention may be that the spray mask itself may be a permanent magnet, the source of the magnetic force. In this case, the wafer need only be placed on a surface of a low reluctance metal such as iron. Here the magnetic force from the spray mask will hold the mask against the wafer. Hence, it is evident that although this invention has been described in connection with certain specific examples thereof, no limitation is intended thereby except as defined in the appended claims.

We claim:

1. A spray mask which interlocks with a pattern of ridges on a face of a semiconductor wafer to enable selective deposition of wax on said wafer face prior to etching thereof, said mask being of a magnetic metal and comprising intersecting portions forming a grid having apertures, said apertures corresponding to discrete dies to be made from said wafer, said grid in a predetermined pattern generally corresponding to said pattern of ridges on said wafer face, a peripheral rim portion surrounding said intersecting portions and forming a rigid unitary body having a continuous face, grooves in said face of said unitary body corresponding to said pattern of ridges on said wafer face, said grooves having a width and depth slightly greater than the width and height of said ridges to permit nesting of said ridges in said grooves and abutment of said unitary body and wafer faces, wherein said nesting of said ridges in said grooves interlocks said unitary body with said wafer and aligns said apertures with portions of said semiconductor wafer on which wax is to be deposited and wherein said grooves are of a V-shaped cross-section subtending an angle of about 60°.

* * * * *